US012812845B2

(12) United States Patent
Liu et al.

(10) Patent No.: US 12,812,845 B2
(45) Date of Patent: Nov. 24, 2026

(54) SEMICONDUCTOR STRUCTURE, AND METHOD FOR FORMING SEMICONDUCTOR STRUCTURE

(71) Applicant: ICLEAGUE TECHNOLOGY CO., LTD., Jiaxing (CN)

(72) Inventors: Fandong Liu, Jiaxing (CN); Wenyu Hua, Jiaxing (CN); Shengqi Cui, Jiaxing (CN); Wenxiang Xu, Jiaxing (CN); Dongmen Song, Jiaxing (CN)

(73) Assignee: ICLEAGUE TECHNOLOGY CO., LTD., Jiaxing (CN)

( * ) Notice: Subject to any disclaimer, the term of this patent is extended or adjusted under 35 U.S.C. 154(b) by 375 days.

(21) Appl. No.: 18/726,800

(22) PCT Filed: May 30, 2022

(86) PCT No.: PCT/CN2022/095909

§ 371 (c)(1),
(2) Date: Jul. 4, 2024

(87) PCT Pub. No.: WO2023/130655

PCT Pub. Date: Jul. 13, 2023

(65) Prior Publication Data

US 2025/0071978 A1 Feb. 27, 2025

(30) Foreign Application Priority Data

Jan. 5, 2022 (CN) ......................... 202210004023.4

(51) Int. Cl.
*H10B 12/00* (2023.01)

(52) U.S. Cl.
CPC ......... *H10B 12/488* (2023.02); *H10B 12/053* (2023.02); *H10B 12/34* (2023.02)

(58) Field of Classification Search
CPC ..... H10B 12/053; H10B 12/34; H10B 12/488
See application file for complete search history.

(56) References Cited

U.S. PATENT DOCUMENTS 4,845,539 A * 7/1989 Inoue .................. H10B 12/395 257/302
2014/0048860 A1 2/2014 Mikasa et al.
(Continued)

FOREIGN PATENT DOCUMENTS

CN 107994018 A 5/2018
CN 109216358 A 1/2019
(Continued)

OTHER PUBLICATIONS

International Search Report for PCT/CN2022/095909 mailed Aug. 5, 2022, ISA/CN.

*Primary Examiner* — Jaehwan Oh
(74) *Attorney, Agent, or Firm* — Yue (Robert) Xu; Apex Attorneys at Law, LLP

(57) ABSTRACT

A semiconductor structure and a method for forming the semiconductor structure are provided. The semiconductor structure includes: a substrate including active areas and isolation regions; a plurality of first recesses disposed in the substrate; a first word line gate structure, a second word line gate structure, a first connection gate and a second connection gate disposed on side surfaces of a first recess; a dielectric layer disposed in the first recess; a second recess and a third recess disposed in the dielectric layer in the isolation regions, central axes of the third recess and the second recess doing not overlap along the second direction; a first isolation structure disposed in the second recess; a second isolation structure disposed in the third recess; a first connection plate disposed on the second connection gate; and a second connection plate disposed on the first connection gate.

20 Claims, 10 Drawing Sheets

(56) References Cited

U.S. PATENT DOCUMENTS

| | | | | |
|---|---|---|---|---|
| 2019/0006369 | A1 | 1/2019 | Chang et al. | |
| 2019/0043864 | A1 | 2/2019 | Takesako et al. | |
| 2019/0273083 | A1* | 9/2019 | Liou | H10B 12/01 |
| 2024/0172418 | A1* | 5/2024 | Hua | H10B 12/05 |
| 2024/0324188 | A1* | 9/2024 | Kim | H10B 12/36 |

FOREIGN PATENT DOCUMENTS

| | | | |
|---|---|---|---|
| CN | 113192955 | A | 7/2021 |
| CN | 113707660 | A | 11/2021 |
| CN | 114023743 | A | 2/2022 |

* cited by examiner

SEMICONDUCTOR STRUCTURE, AND METHOD FOR FORMING SEMICONDUCTOR STRUCTURE

CROSS-REFERENCE TO RELATED APPLICATIONS

This application is a National Stage of International Application No. PCT/CN2022/095909, filed on May 30, 2022, which claims the priority to Chinese Application No. 202210004023.4, filed on Jan. 5, 2022, both of which are incorporated herein by reference.

TECHNICAL FIELD

The present disclosure relates to the field of semiconductor manufacturing, and more particularly, to a semiconductor structure and a method for forming the semiconductor structure.

BACKGROUND

Dynamic Random Access Memory (DRAM) is a semiconductor memory which use the amount of charges stored in a capacitor memory to represent a binary bit being 1 or 0.

Typically, a basic storage unit of DRAM consists of a transistor and a storage capacitor, while a storage array is generally composed of multiple storage units. Therefore, the memory chip's area is influenced by the size of the basic storage unit.

Conventional dynamic random access memory still needs to be improved.

SUMMARY

According to embodiments of the present disclosure, a semiconductor structure and a method for forming the semiconductor structure are provided for improving performance of dynamic random access memory.

For solving aforementioned problems, embodiments of the present disclosure provide a semiconductor structure. The semiconductor structure includes: a substrate; a plurality of first recesses disposed in parallel along a second direction in the substrate; a first word line gate structure, a second word line gate structure, a first connection gate and a second connection gate which are disposed on side surfaces of a first recess; a dielectric layer disposed in the first recess; a second recess disposed in the dielectric layer in an isolation region; a third recess disposed in the dielectric layer in an isolation region; a first isolation structure disposed in the second recess; a second isolation structure disposed in the third recess; a first connection plate disposed on the second connection gate; and a second connection plate disposed on the first connection gate. The substrate includes a plurality of active areas arranged in parallel along a first direction and a plurality of isolation regions, and the first direction is parallel to a surface of the substrate. The plurality of first recesses correspondingly run through the plurality of active areas and the plurality of isolation regions. The second direction is parallel to the surface of the substrate and perpendicular to the first direction. The first word line gate structure and the second word line gate structure are respectively disposed on a side surface of the first recess parallel to the first direction, the first connection gate and the second connection gate are respectively disposed on a side surface of the first recess parallel to the second direction, and two ends of the first word line gate structure are respectively connected with two ends of the second word line gate structure through the first connection gate and the second connection gate. The dielectric layer is disposed on the first word line gate structure, on the second word line gate structure, on the first connection gate, and on the second connection gate. The second recess runs through the first word line gate structure along the second direction. The third recess runs through the second word line gate structure along the second direction. A central axis of the third recess along the second direction does not overlap with a central axis of the second recess along the second direction. The first connection plate is electrically connected with the first word line gate structure through the second connection gate. The second connection plate is electrically connected with the second word line gate structure through the first connection gate.

According to some embodiments, top surfaces of the first word line gate structure, the second word line gate structure, the first connection gate, the second connection gate and the dielectric layer are lower than a top surface of the substrate.

According to some embodiments, the semiconductor structure further includes: an insulating layer disposed on the side surfaces and a bottom surface of the first recess. The first word line gate structure, the second word line gate structure, the first connection gate and the second connection gate are disposed on the insulating layer on the side surfaces of the first recess.

According to some embodiments, the insulating layer is made of a material including a dielectric material, and the dielectric material includes silicon oxide.

According to some embodiments, the first word line gate structure, the second word line gate structure, the first connection gate, and the second connection gate are made of a material including metal, and the metal includes tungsten.

According to some embodiments, the substrate includes a first region, the plurality of active areas are arranged in the first region, and the isolation region is adjacent to the first region. The first isolation structure and the second isolation structure are respectively disposed in the isolation regions on both sides of the first region.

According to some embodiments, the dielectric layer is made of a material including silicon oxide.

According to some embodiments, the first connection plate and the second connection plate are made of a material including metal, and the metal includes one or more selected from a group consisting of copper, aluminum, tungsten, cobalt, nickel and tantalum.

According to some embodiments, a spacing between the first word line gate structure and the second word line gate structure ranges from 15 nanometers to 20 nanometers.

Accordingly, embodiments of the present disclosure also provide a method for forming a semiconductor structure. The method includes: providing a substrate, the substrate including a plurality of active areas arranged in parallel along a first direction and a plurality of isolation regions, and the first direction being parallel to a surface of the substrate; forming a plurality of first recesses in the substrate, the plurality of first recesses being disposed in parallel along a second direction and correspondingly running through the plurality of active areas and the plurality of isolation regions, and the second direction being parallel to the surface of the substrate and perpendicular to the first direction; forming a first word line gate structure, a second word line gate structure, a first connection gate and a second connection gate on side surfaces of a first recess, the first word line gate structure and the second word line gate structure being respectively disposed on a side surface of the first recess parallel to the first direction, the first connection gate and the second connection gate being respectively disposed on a side surface of the first recess parallel to the second direction, and two ends of the first word line gate structure being respectively connected with two ends of the second word line gate structure through the first connection gate and the second connection gate; forming a dielectric layer in the first recess, the dielectric layer being disposed on the first word line gate structure, on the second word line gate structure, on the first connection gate, and on the second connection gate; removing the first word line gate structure and a part of the dielectric layer in an isolation region to form a second recess in the dielectric layer, the second recess running through the first word line gate structure along the second direction; removing the second word line gate structure and a part of the dielectric layer in an isolation region to form a third recess in the dielectric layer, the third recess running through the second word line gate structure along the second direction, and a central axis of the third recess along the second direction doing not overlap with a central axis of the second recess along the second direction; forming a first isolation structure in the second recess, and forming a second isolation structure in the third recess; after forming the first isolation structure and the second isolation structure, forming a first connection plate on the second connection gate, and the first connection plate being electrically connected with the first word line gate structure through the second connection gate; and forming a second connection plate on the first connection gate, and the second connection plate being electrically connected with the second word line gate structure through the first connection gate.

According to some embodiments, top surfaces of the first word line gate structure, the second word line gate structure, the first connection gate, the second connection gate and the dielectric layer are lower than a top surface of the substrate.

According to some embodiments, the method further includes: before forming the first word line gate structure, the second word line gate structure, the first connection gate and the second connection gate on the side surfaces of the first recess, forming an insulating layer on the side surfaces and a bottom surface of the first recess. The first word line gate structure, the second word line gate structure, the first connection gate and the second connection gate are disposed on the insulating layer on the side surfaces of the first recess.

According to some embodiments, a method for forming the first word line gate structure, the second word line gate structure, the first connection gate, the second connection gate and the dielectric layer includes: forming a gate material layer on the insulating layer; removing the gate material layer at a bottom of the first recess, and forming an initial first word line gate structure, an initial second word line gate structure, an initial first connection gate, and an initial second connection gate on the insulating layer on the side surfaces of the first recess; forming an initial dielectric layer in the first recess, and the initial dielectric layer being disposed on the insulating layer, on the initial first word line gate structure, on the initial second word line gate structure, on the initial first connection gate and on the initial second connection gate; and etching back the initial first word line gate structure, the initial second word line gate structure, the initial first connection gate, the initial second connection gate, the initial dielectric layer and the gate material layer disposed on the surface of the substrate until a part of the insulating layer on sides of the first recess being exposed, forming the first word line gate structure, the second word line gate structure, the first connection gate and the second connection gate on the insulating layer on the side surfaces of the first recess, and forming the dielectric layer in the first recess.

According to some embodiments, the gate material layer is made of a material including metal, and the metal includes tungsten.

According to some embodiments, removing the gate material layer at the bottom of the first recess includes a plasma etching process.

According to some embodiments, etching back the initial first word line gate structure, the initial second word line gate structure, the initial first connection gate, the initial second connection gate, the initial dielectric layer and the gate material layer disposed on the surface of the substrate includes a dry etching process.

According to some embodiments, the insulating layer is made of a material including a dielectric material, and the dielectric material includes silicon oxide.

According to some embodiments, removing the first word line gate structure and a part of the dielectric layer in an isolation region and removing the second word line gate structure and a part of the dielectric layer in an isolation region include a dry etching process or a wet etching process.

According to some embodiments, the dry etching process includes a first etching and a second etching, process parameters of the first etching include an etching gas including hydrogen fluoride, and process parameters of the second etching include an etching gas including chlorine.

According to some embodiments, the substrate includes a first region, the plurality of active areas are arranged in the first region, and the isolation region is adjacent to the first region; and the first isolation structure and the second isolation structure are respectively disposed in the isolation regions on both sides of the first region.

According to some embodiments, the dielectric layer is made of a material including silicon oxide.

Compared with the conventional technology, the present disclosure has the following advantages.

According to embodiments of the present disclosure, the first word line gate structure and a part of the dielectric layer in an isolation region are removed to form a second recess in the dielectric layer, the second word line gate structure and a part of the dielectric layer in an isolation region are removed to form a third recess in the dielectric layer, and the central axis of the third recess along the second direction does not overlap with the central axis of the second recess along the second direction. On one hand, the first word line gate structure and the second word line gate structure can be separated by the second recess and the third recess, and a first connection plate electrically connected with the first word line gate structure and a second connection plate electrically connected with the second word line gate structure are subsequently formed and respectively disposed on both sides of the first recess, thereby reducing a risk of short circuit between the first connection plate and the second connection plate. On the other hand, the second connection plate is disposed on the first connection gate, and the first connection plate is disposed on the second connection gate, so a process for separating the first connection gate and the second connection gate can be omitted, which avoids damaging the first word line gate structure and the second word line gate structure during the process for separating the first connection gate and the second connection gate while a spacing between the first word line gate structure and the second word line gate structure is small. Therefore, a performance of the semiconductor structure can be improved and a process window can be enlarged.

Further, the substrate includes a first region, the plurality of active areas are arranged in the first region, and the isolation region is adjacent to the first region; the first isolation structure and the second isolation structure are respectively disposed in the isolation regions on both sides of the first region. Therefore, the first word line gate structure and the second word line gate structure can completely cross the active area in the first region, which ensures completeness of input signals of the first word line gate structure and the second word line gate structure.

DETAILED DESCRIPTION

As described in the background, conventional dynamic random access memory still needs to be improved. Analysis and explanation are provided in conjunction with examples.

Figure 1:
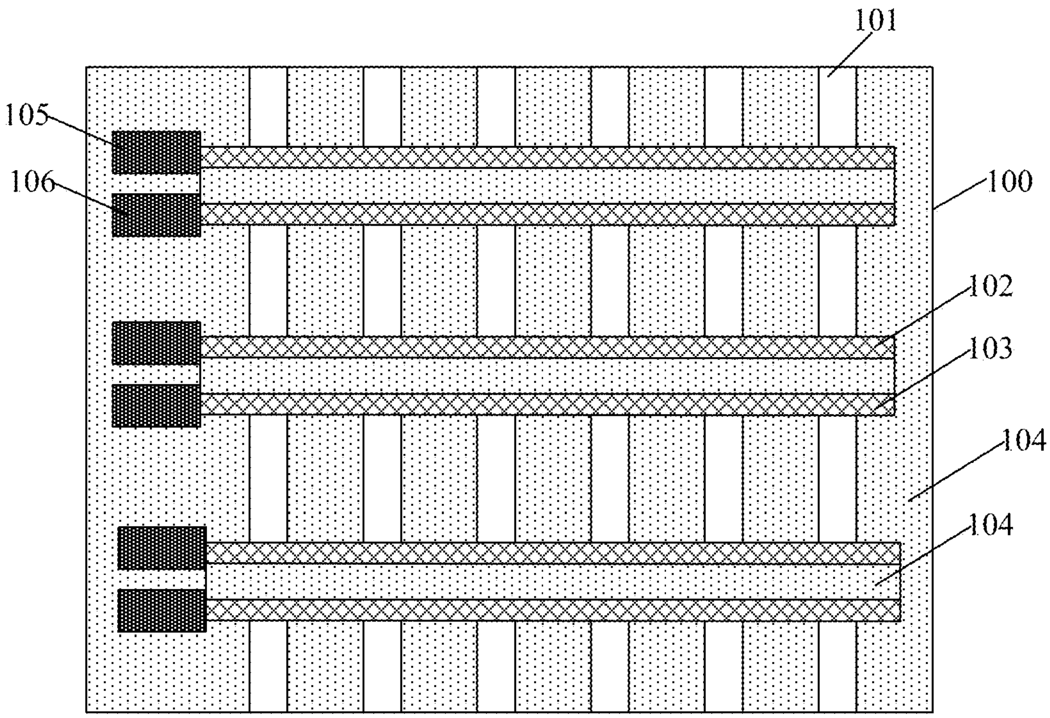
FIG. 1 schematically illustrates a structural diagram of a semiconductor structure according to an example.

FIG. 1 schematically illustrates a structural diagram of a semiconductor structure according to an example.

Referring to FIG. 1, the semiconductor structure includes: a substrate 100 including a plurality of active areas 101 arranged in parallel along a first direction; a plurality of first recesses (not shown) disposed in parallel along a second direction in the substrate 100; a first word line gate structure 102 and a second word line gate structure 103 disposed on side surfaces of the first recess; a dielectric layer 104 disposed in the first recess, and on the first word line gate structure 102 and on the second word line gate structure 103; and a first connection plate 105 disposed on the first word line gate structure 102 and a second connection plate 106 disposed on the second word line gate structure 103. The plurality of first recesses run through the plurality of active areas. The second direction is parallel to a surface of the substrate 100 and perpendicular to the first direction. The first word line gate structure 102 and the second word line gate structure 103 are respectively disposed on a side surface of the first recess parallel to the first direction. The first connection plate 105 and the second connection plate 106 are disposed at a same end of the first word line gate structure 102 and the second word line gate structure 103.

In the semiconductor structure, the first connection plate 105 and the second connection plate 106 are disposed at the same end of the first word line gate structure 102 and the second word line gate structure 103, which leads to a small spacing between two adjacent connection plates. A high-density device including such structure has an extreme high probability of short circuit and has high requirements for a manufacturing process. At the same time, before forming the first connection plate 105 and the second connection plate 106, a process is required to remove a gate material layer which is formed simultaneously with the first word line gate structure 102 and the second word line gate structure 103 and formed on side surfaces of the first recess parallel to the second direction, so that the first word line gate structure 102 and the second word line gate structure 103 can be separated. Since a spacing between the first word line gate structure 102 and the second word line gate structure 103 is relatively small, the process for removing the gate material layer may easily cause damage to the first word line gate structure 102 and the second word line gate structure 103.

Figure 2:
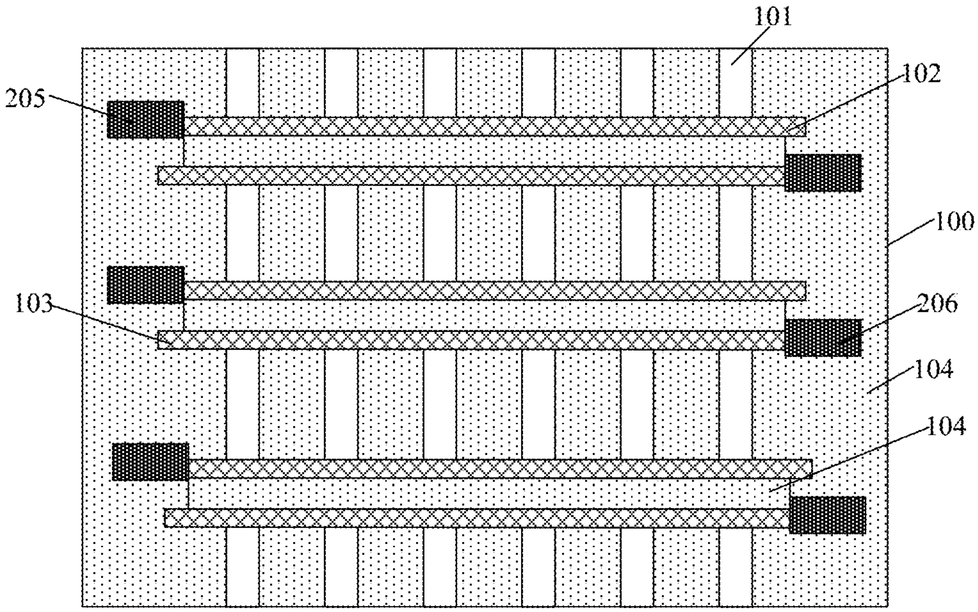
FIG. 2 schematically illustrates a structural diagram of a semiconductor structure according to another example.

FIG. 2 schematically illustrates a structural diagram of a semiconductor structure according to another example.

Referring to FIG. 2, the semiconductor structure includes: a substrate 100 including a plurality of active areas 101 arranged in parallel along a first direction; a plurality of first recesses (not shown) disposed in parallel along a second direction in the substrate 100; a first word line gate structure 102 and a second word line gate structure 103 disposed on side surfaces of the first recess; a dielectric layer 104 disposed in the first recess, and on the first word line gate structure 102 and on the second word line gate structure 103; and a first connection plate 205 disposed on the first word line gate structure 102 and a second connection plate 206 disposed on the second word line gate structure 103. The plurality of first recesses run through the plurality of active areas. The second direction is parallel to a surface of the substrate 100 and perpendicular to the first direction. The first word line gate structure 102 and the second word line gate structure 103 are respectively disposed on a side surface of the first recess parallel to the first direction. The first connection plate 205 and the second connection plate 206 are respectively disposed at opposite ends of the first word line gate structure 102 and the second word line gate structure 103.

In the semiconductor structure, the first connection plate 205 and the second connection plate 206 are respectively disposed at opposite ends of the first word line gate structure 102 and the second word line gate structure 103. Since a spacing between the first word line gate structure 102 and the second word line gate structure 103 is small, the first connection plate 205 is easily subject to short-circuit with the second word line gate structure 103, and the second connection plate 206 is easily subject to short-circuit with the first word line gate structure 102. An end of the first word line gate structure 102 and an end of the second word line gate structure 103 that do not form a connection plate need to be reprocessed, which makes the process complicated. At the same time, it still needs to remove a gate material layer which is formed simultaneously with the first word line gate structure 102 and the second word line gate structure 103 and formed on side surfaces of the first recess parallel to the second direction.

For solving aforementioned problems, embodiments of the present disclosure provide a semiconductor structure and a method for forming a semiconductor structure. The first word line gate structure and a part of the dielectric layer in an isolation region can be removed to form a second recess in the dielectric layer, the second word line gate structure and a part of the dielectric layer in an isolation region are removed to form a third recess in the dielectric layer, and a central axis of the third recess along the second direction does not overlap with a central axis of the second recess along the second direction. On one hand, the first word line gate structure and the second word line gate structure can be separated by the second recess and the third recess, and a first connection plate electrically connected with the first word line gate structure and a second connection plate electrically connected with the second word line gate structure are subsequently formed and respectively disposed on both sides of the first recess, thereby reducing a risk of short circuit between the first connection plate and the second connection plate. On the other hand, the second connection plate is disposed on the first connection gate, and the first connection plate is disposed on the second connection gate, so a process for separating the first connection gate and the second connection gate can be omitted, which avoids damaging the first word line gate structure and the second word line gate structure during the process for separating the first connection gate and the second connection gate while a spacing between the first word line gate structure and the second word line gate structure is small. Therefore, a performance of the semiconductor structure can be improved and a process window can be enlarged.

In order to make the aforementioned purposes, features and beneficial effects of the present disclosure clearer and easier to understand, the embodiments of the present disclosure are described in detail below with reference to the accompanying drawings.

FIG. 3 to FIG. 17 schematically illustrate diagrams of an intermediate semiconductor structure according to an embodiment of the present disclosure.

Figure 3:
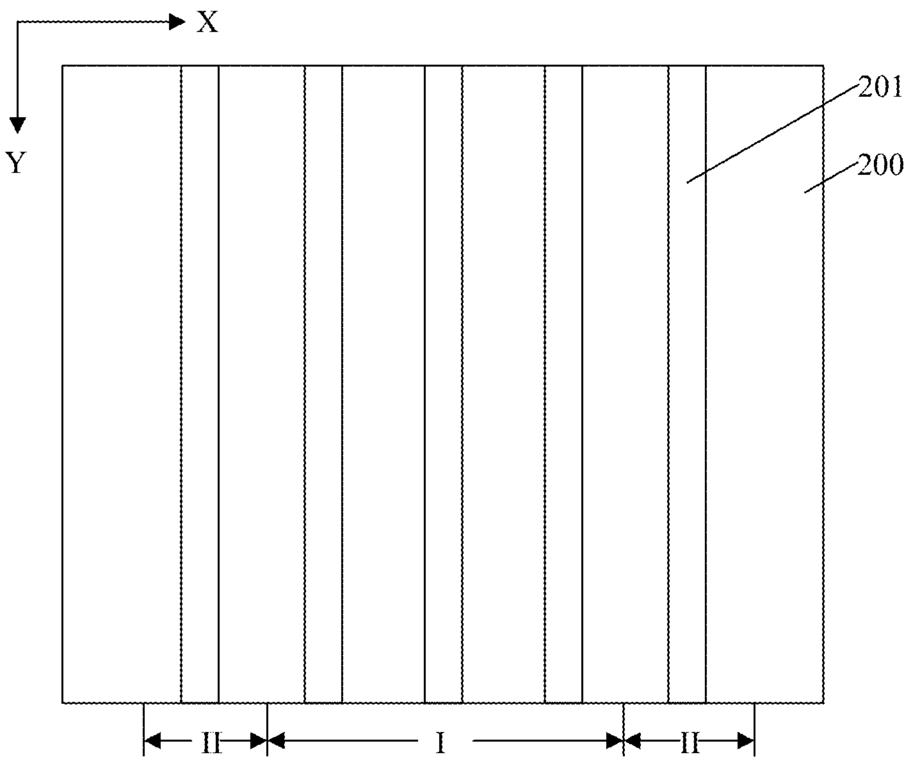
FIG. 3 to FIG. 17 schematically illustrate diagrams of an intermediate semiconductor structure according to an embodiment of the present disclosure.

Referring to FIG. 3, a substrate 200 is provided, and the substrate 200 includes a plurality of active areas 201 arranged in parallel along a first direction X and a plurality of isolation regions II. An active area 201 extends in a direction parallel to a second direction Y. The first direction X is parallel to a surface of the substrate 200, and the second direction Y is parallel to the surface of the substrate 200 and perpendicular to the first direction X.

According to some embodiments, the substrate 200 includes a first region I, the plurality of active areas 201 are arranged in the first region I, and the isolation region II is adjacent to the first region I.

According to some embodiments, the substrate 200 is made of a material including silicon.

According to some embodiments, the substrate 200 is made of a material including silicon carbide, silicon germanium, a multi-element semiconductor material composed of elements in group III-V, Silicon On Insulator (SOI), or Germanium On Insulator (GOI). Among them, the multi-element semiconductor material composed of elements in group III-V includes InP, GaAs, GaP, InAs, InSb, InGaAs, or InGaAsP.

Figure 4:
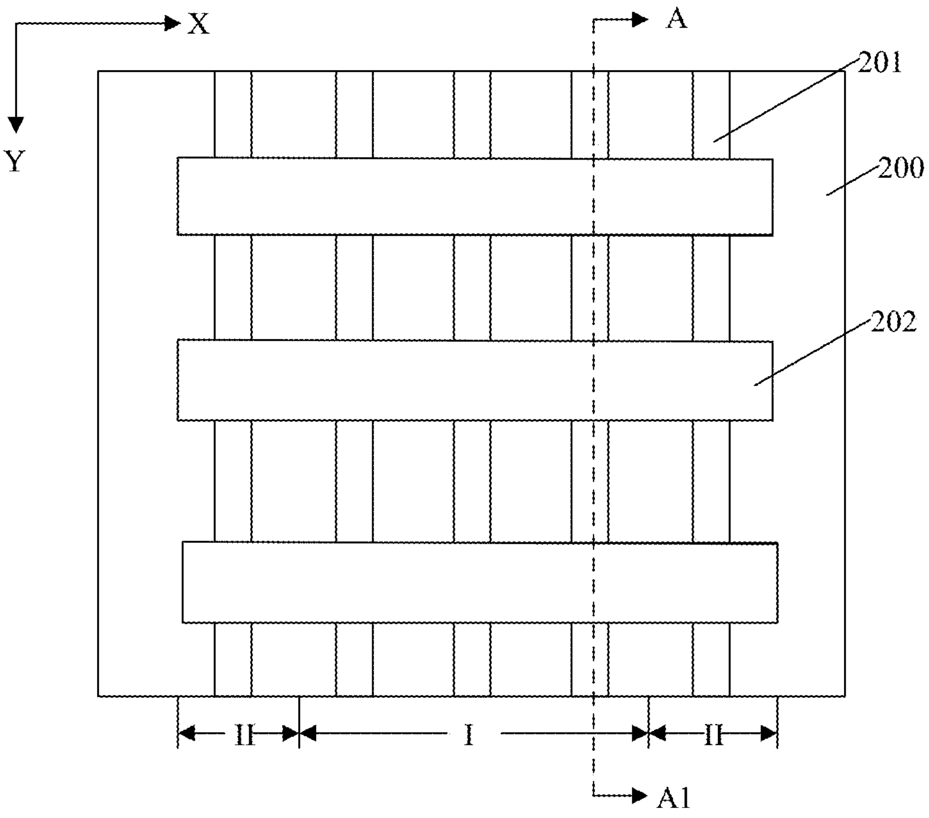
Figure 5:
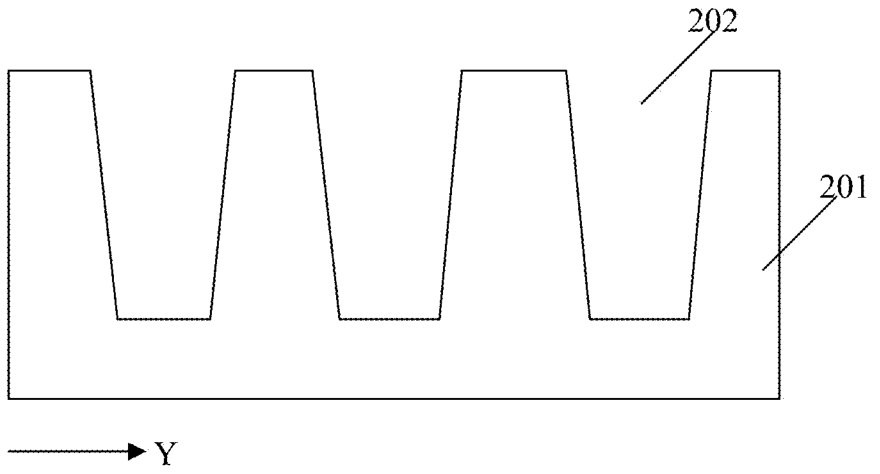

Referring to FIG. 4 and FIG. 5, FIG. 4 is a top view of FIG. 5, and FIG. 5 schematically illustrates a cross-sectional structural diagram along the section line AA1 in FIG. 4. A plurality of first recesses 202 are formed in the substrate 200 and disposed in parallel along the second direction Y. The plurality of first recesses 202 run through the plurality of active areas 201 and the plurality of isolation regions II.

According to some embodiments, a depth to width ratio of the first recess 202 is greater than 6.

Figure 6:
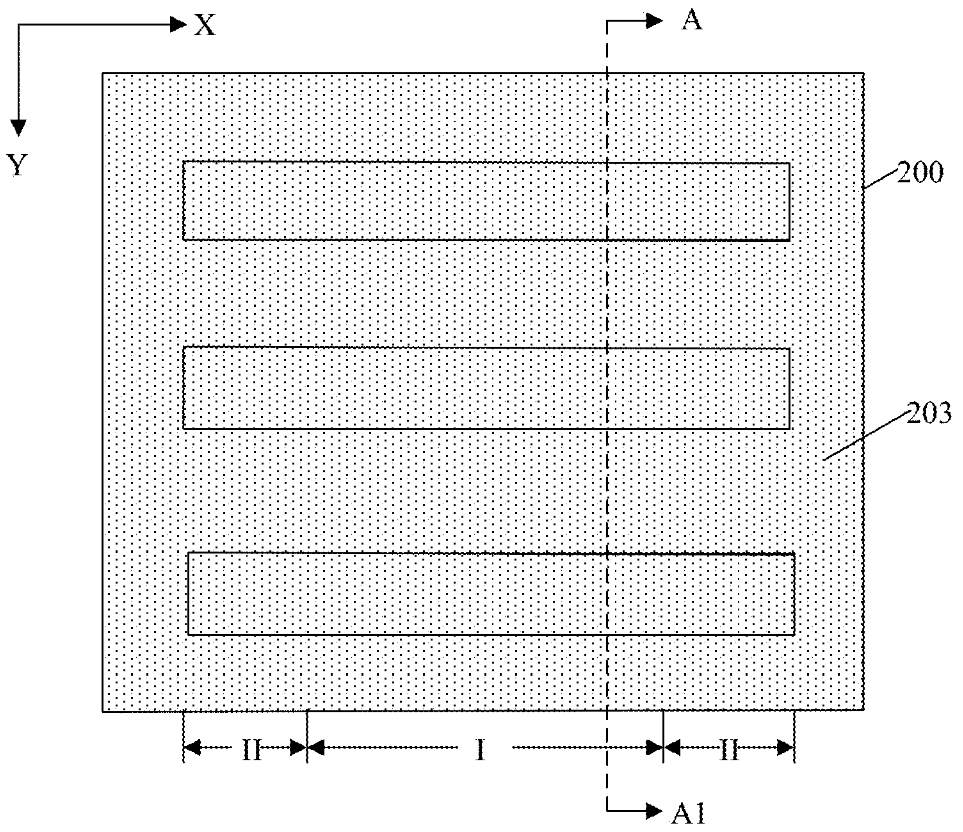
Figure 7:
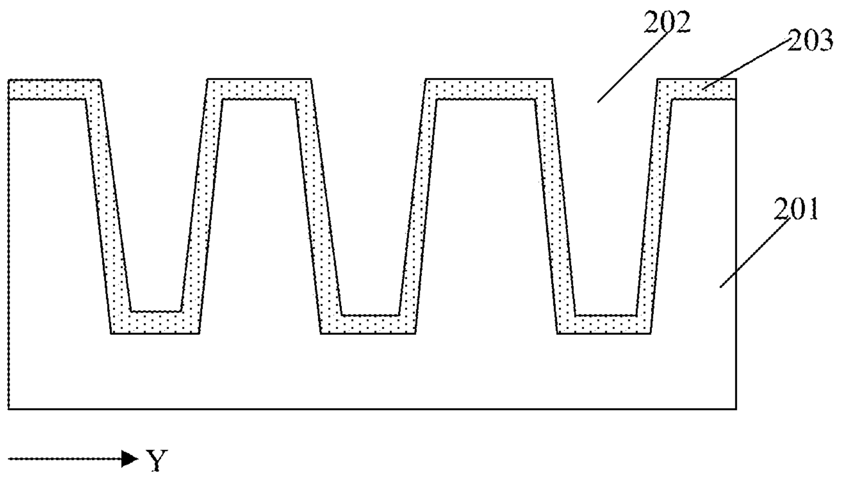

Referring to FIG. 6 and FIG. 7, FIG. 6 is a top view of FIG. 7, and FIG. 7 schematically illustrates a cross-sectional structural diagram along the section line AA1 in FIG. 6. An insulating layer 203 is formed on side surfaces and a bottom surface of the first recess 202.

The insulating layer 203 is made of a material including a dielectric material. The dielectric material includes one or more selected from a group consisting of silicon oxide, silicon nitride, silicon carbide, silicon oxycarbide, silicon oxynitride, aluminum oxide, aluminum nitride, silicon carbide nitride, and silicon oxy-carbon nitride.

According to some embodiments, the insulating layer is made of a material including silicon oxide.

Thereafter, a first word line gate structure, a second word line gate structure, a first connection gate, and a second connection gate are formed on the insulating layer 203 on the side surfaces of the first recess 202. The first word line gate structure and the second word line gate structure are respectively disposed on a side surface of the first recess 202 parallel to the first direction X. The first connection gate and the second connection gate are respectively disposed on a side surface of the first recess 202 parallel to the second direction Y. Two ends of the first word line gate structure are respectively connected with two ends of the second word line gate structure through the first connection gate and the second connection gate. A process for forming the first word line gate structure, the second word line gate structure, the first connection gate, and the second connection gate can be referred to FIG. 8 to FIG. 13.

Figure 8:
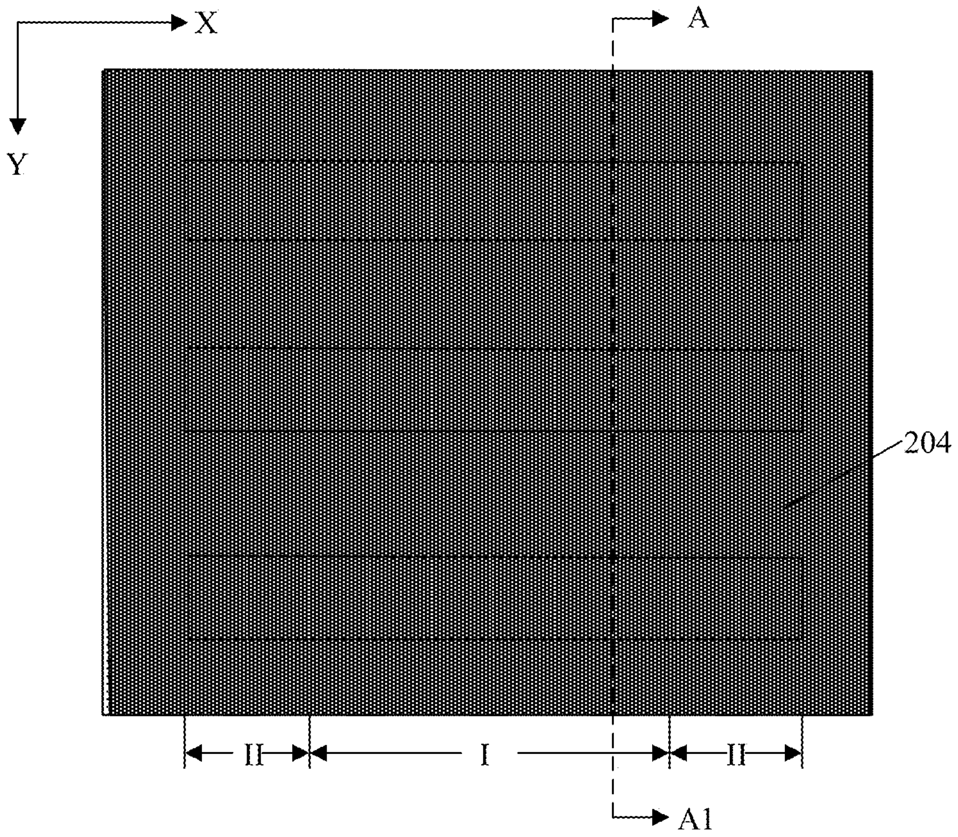
Figure 9:
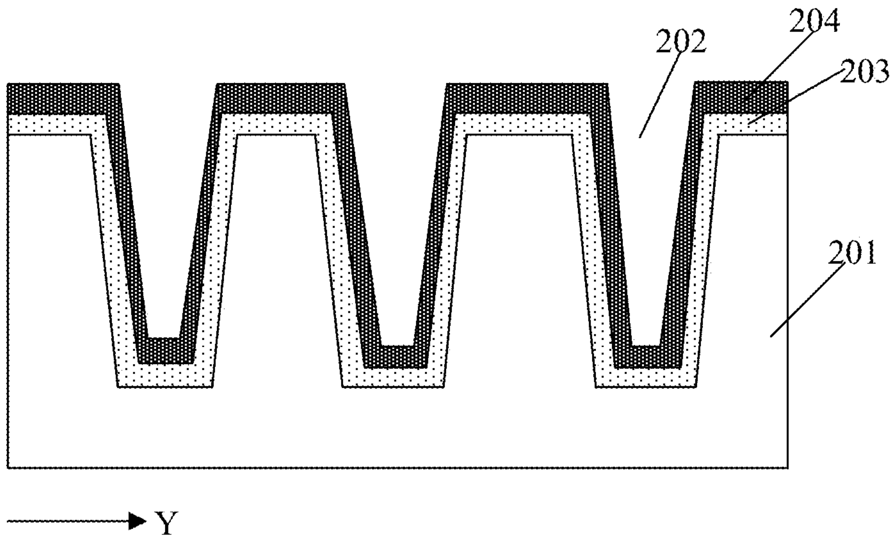

Referring to FIG. 8 and FIG. 9, FIG. 8 is a top view of FIG. 9, and FIG. 9 schematically illustrates a cross-sectional structural diagram along the section line AA1 in FIG. 8. A gate material layer 204 is formed on the insulating layer 203.

The gate material layer 204 is made of a material including metal, and the metal includes one or more selected from a group consisting of copper, aluminum, tungsten, cobalt, nickel and tantalum.

According to some embodiments, the gate material layer 204 is made of a material including tungsten.

Figure 10:
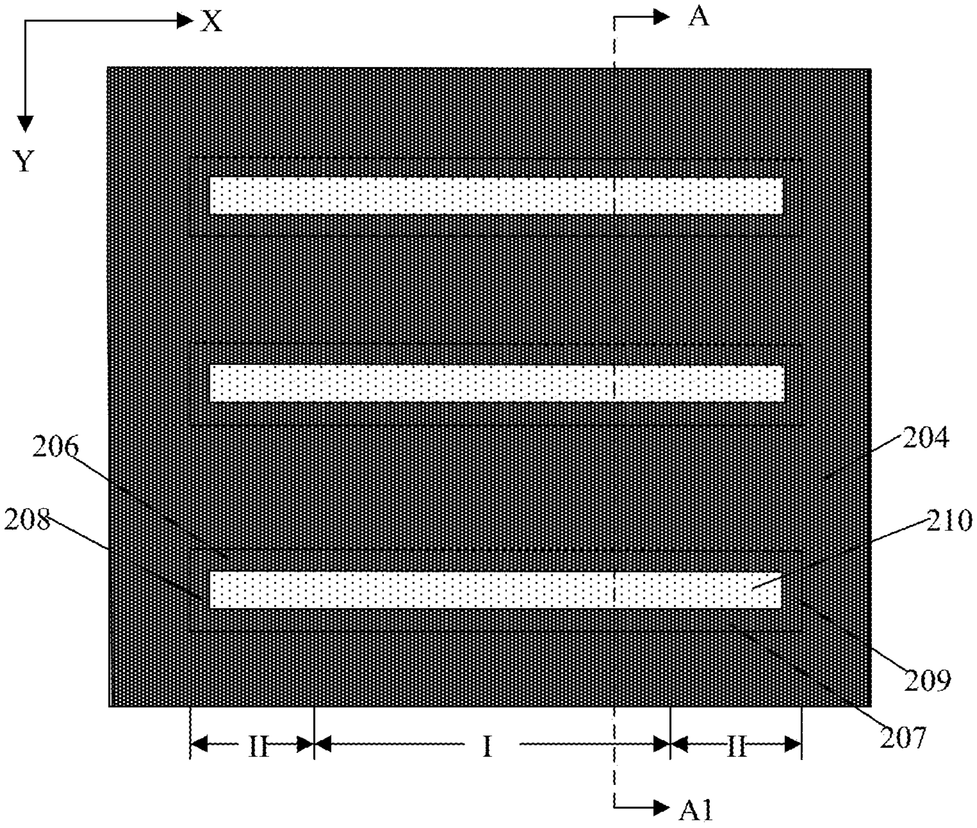
Figure 11:
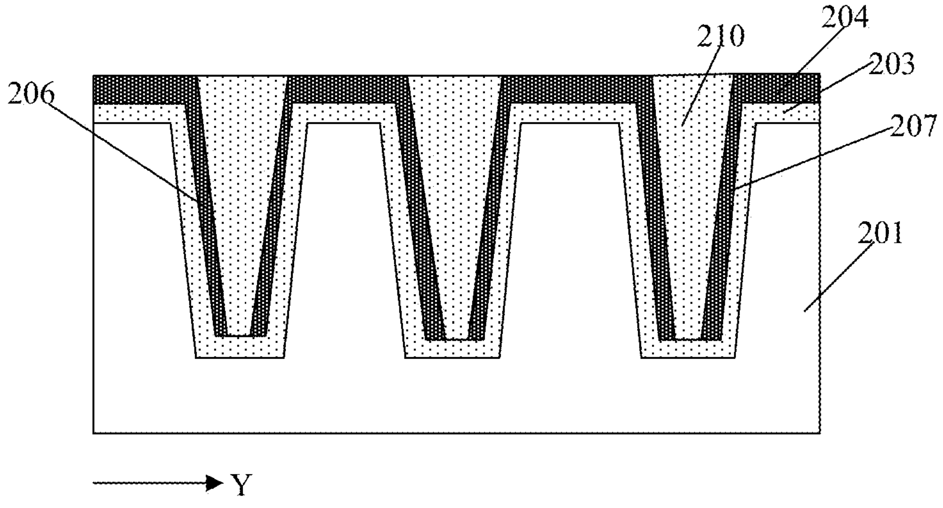

Referring to FIG. 10 and FIG. 11, FIG. 10 is a top view of FIG. 11, and FIG. 11 schematically illustrates a cross-sectional structural diagram along the section line AA1 in FIG. 10. The gate material layer 204 at a bottom of the first recess 202 is removed, and an initial first word line gate structure 206, an initial second word line gate structure 207, an initial first connection gate 208, and an initial second connection gate 209 are formed on the insulating layer on the side surfaces of the first recess 202.

A process for removing the gate material layer 204 at the bottom of the first recess 202 includes a plasma etching process. The plasma etching process is provided with a high energy to remove the gate material layer 204 at the bottom of the first recess 202 with a wide range of depth to width ratio.

A method for removing the gate material layer 204 at the bottom of the first recess 202 includes: forming a mask layer (not shown) on a substrate, a surface of the gate material layer 204 at the bottom of the first recess 202 being exposed by the mask layer; and removing the gate material layer 204 at the bottom of the first recess 202 through the plasma etching process.

Referring to FIG. 10 and FIG. 11, an initial dielectric layer 210 is formed in the first recess 202. The initial dielectric layer 210 is disposed on the insulating layer 203, on the initial first word line gate structure 206, on the initial second word line gate structure 207, on the initial first connection gate 208, and on the initial second connection gate 209.

A method for forming the initial dielectric layer 210 includes: forming a dielectric material layer (not shown) in the first recess 202 and on the gate material layer 204; and planarizing the dielectric material layer until a surface of the gate material layer 204 being exposed to form the initial dielectric layer 210 in the first recess 202.

The initial dielectric layer 210 is made of a material including a dielectric material. The dielectric material includes one or more selected from a group consisting of silicon oxide, silicon nitride, silicon carbide, silicon carbide, silicon carbon oxide, silicon nitride, aluminum oxide, aluminum nitride, silicon nitride carbide, and silicon oxy-carbon nitride.

According to some embodiments, the initial dielectric layer 210 is made of a material including silicon oxide.

Figure 12:
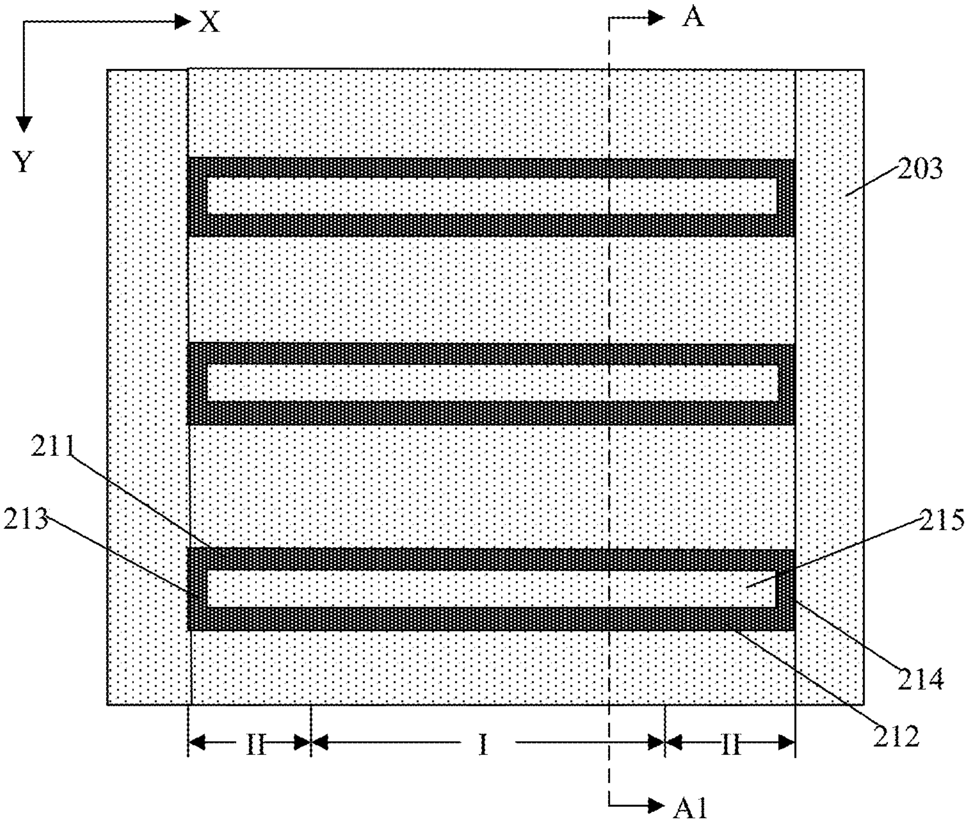
Figure 13:
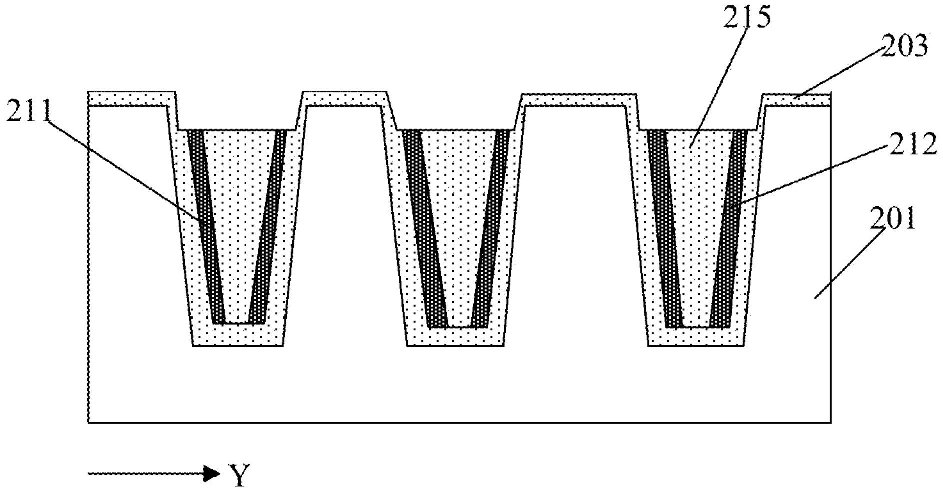

Referring to FIG. 12 and FIG. 13, FIG. 13 is a top view of FIG. 12, and FIG. 13 schematically illustrates a cross-sectional structural diagram along the section line AA1 in FIG. 12. The initial first word line gate structure 206, the initial second word line gate structure 207, the initial first connection gate 208, the initial second connection gate 209, the initial dielectric layer 210 and the gate material layer 204 disposed on the surface of the substrate 200 are etched back until a part of the insulating layer 203 on sides of the first recess 202 is exposed. The first word line gate structure 211, the second word line gate structure 212, the first connection gate 213 and the second connection gate 214 are formed on the insulating layer 203 on the side surfaces of the first recess 202, and the dielectric layer 215 is formed in the first recess 202.

A process for etching back the initial first word line gate structure 206, the initial second word line gate structure 207, the initial first connection gate 208, the initial second connection gate 209, the initial dielectric layer 210, and the gate material layer 204 disposed on the surface of the substrate 200 includes a dry etching process.

According to some embodiments, top surfaces of the first word line gate structure 211, the second word line gate structure 212, the first connection gate 213 and second connection gate 214 and dielectric layer 215 are lower than a top surface of the substrate 200. Therefore, an isolation layer can be subsequently formed on the surface of the first word line gate structure 211, the second word line gate structure 212, the first connection gate 213 and the second connection gate 214, thereby avoiding the surface of the first word line gate structure 211, the second word line gate structure 212, the first connection gate 213 and the second connection gate 214 being in electrical connection with a subsequently formed source-drain doped region in the substrate.

Figure 14:
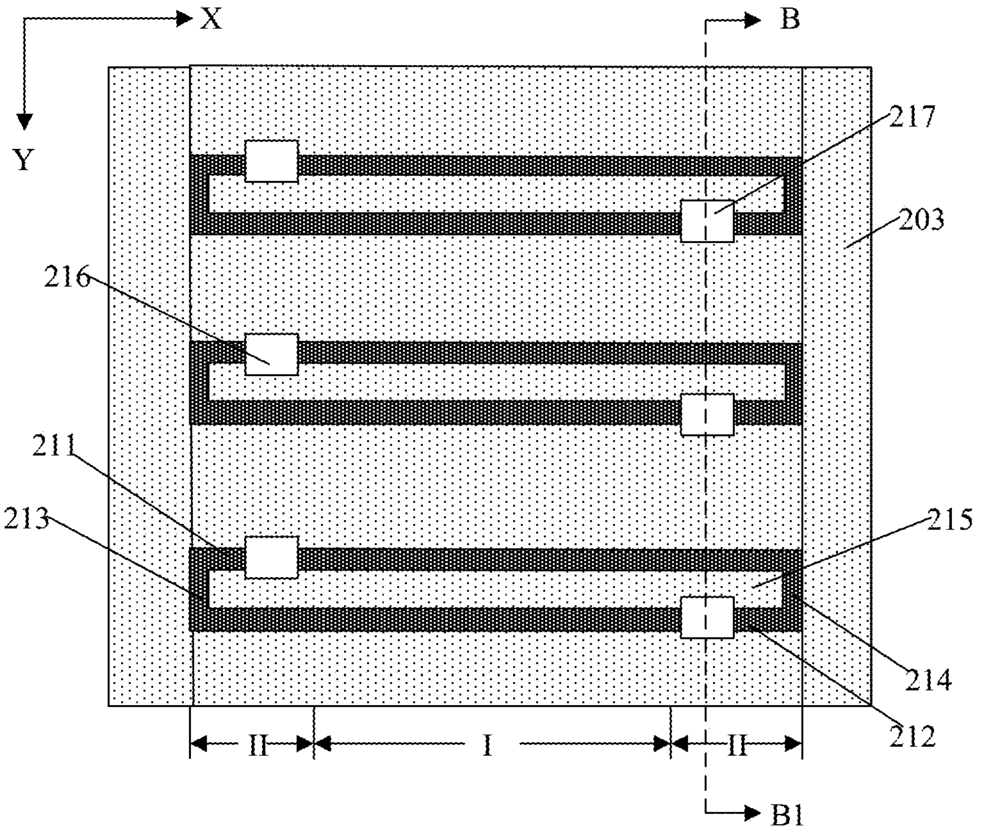
Figure 15:
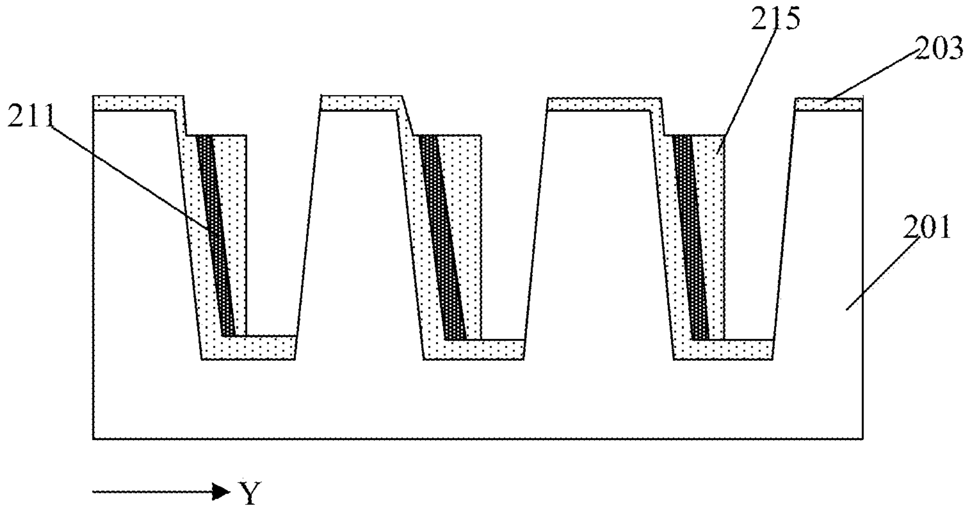

Referring to FIG. 14 and FIG. 15, FIG. 15 is a top view of FIG. 14, and FIG. 15 schematically illustrates a cross-sectional structural diagram along the section line BB1 in FIG. 14. The first word line gate structure 211 and a part of the dielectric layer 215 in an isolation region II are removed, and a second recess 216 is formed in the dielectric layer 215. The second recess 216 runs through the first word line gate structure 211 along the second direction Y.

The second word line gate structure 212 and a part of the dielectric layer 215 in an isolation region II are removed, and a third recess 217 is formed in the dielectric layer 215. The third recess 217 runs through the second word line gate structure 212 along the second direction Y. A central axis of the third recess 217 along the second direction Y does not overlap with a central axis of the second recess 216 along the second direction Y.

The second word line gate structure 212 and the first word line gate structure 211 in the isolation regions II are removed simultaneously.

The isolation region II is adjacent to the first region I, and the central axis of the third recess 217 in an isolation region II does not overlap with the central axis of the second recess 216 in an isolation region II along the second direction Y. Therefore, the first word line gate structure 211 and the second word line gate structure 212 can be separated by the second recess 216 and the third recess 217, and a first connection plate electrically connected with the first word line gate structure 211 and a second connection plate electrically connected with the second word line gate structure 212 are subsequently formed and respectively disposed on both sides of the first recess 202, thereby reducing a risk of short circuit between the first connection plate and the second connection plate.

A process for removing the first word line gate structure 211 and a part of the dielectric layer 215 in the isolation region II, and a process for removing the second word line gate structure 212 and a part of the dielectric layer 215 in the isolation region II include a dry etch process or a wet etch process.

According to some embodiments, the process for removing the first word line gate structure 211 and a part of the dielectric layer 215 in the isolation region II, and a process for removing the second word line gate structure 212 and a part of the dielectric layer 215 in the isolation region II include a dry etch process, and the dry etching process includes a first etching and a second etching.

The first etching is used for removing a part of the dielectric layer 215, and the second etching is used for removing the first word line gate structure 211 and the second word line gate structure 212.

According to some embodiments, process parameters of the first etching include an etching gas including hydrogen fluoride, and process parameters of the second etching include an etching gas including chlorine.

According to some embodiments, the first etching is performed followed by the second etching. Therefore, the first word line gate structure 211 and the second word line gate structure 212 in the isolation regions II can be removed completely.

Figure 16:
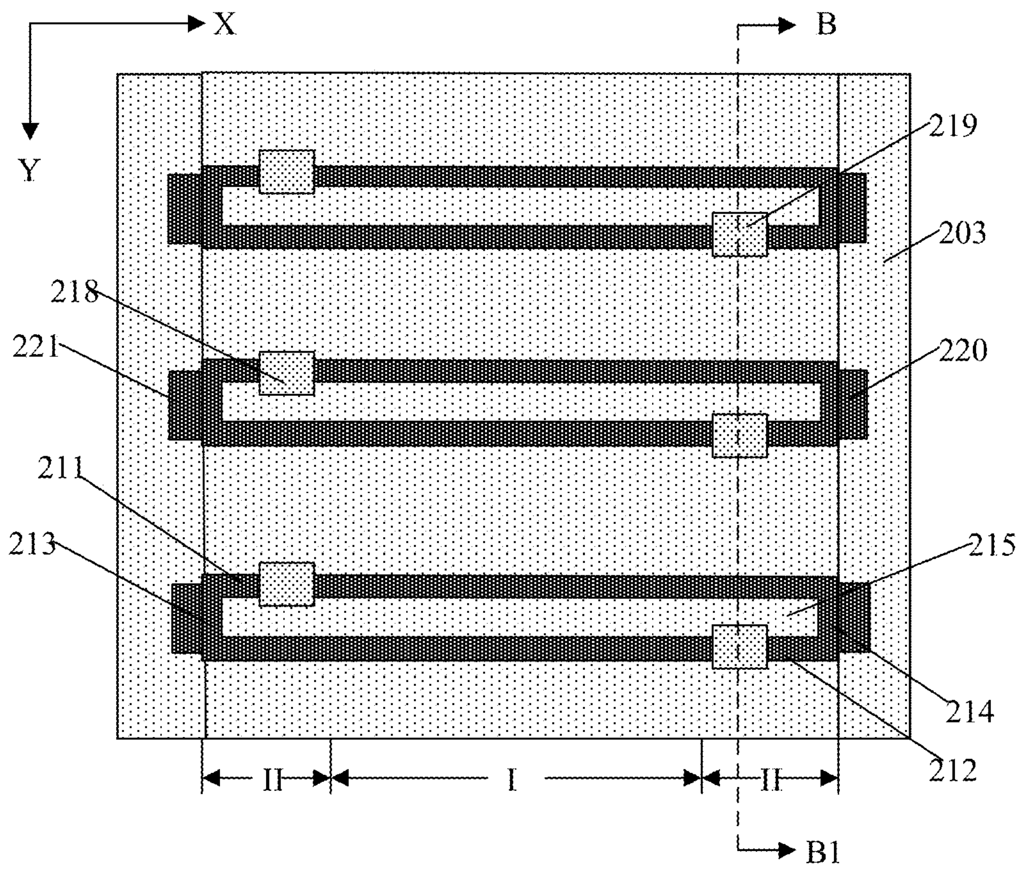
Figure 17:
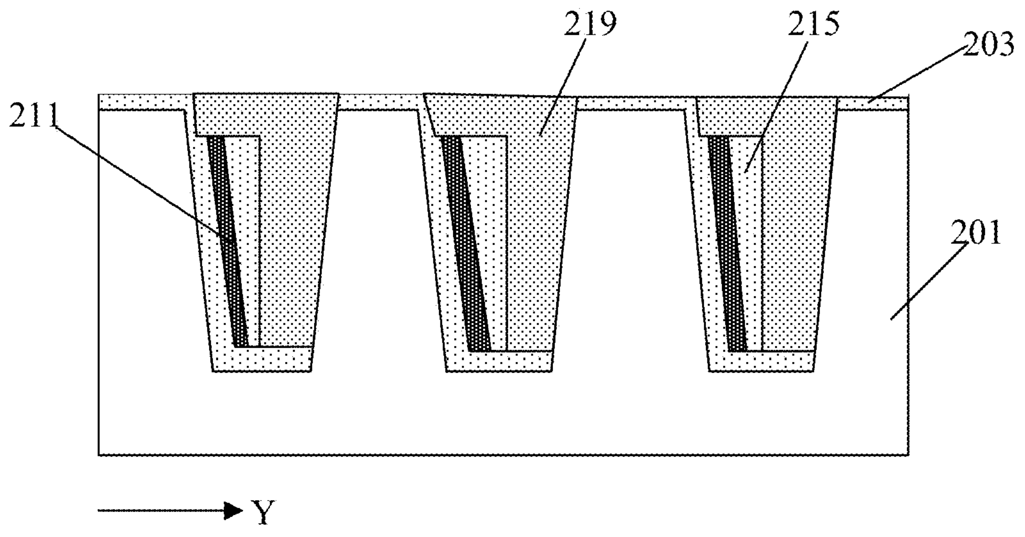

Referring to FIG. 16 and FIG. 17, FIG. 16 is a top view of FIG. 17, and FIG. 17 schematically illustrates a cross-sectional structural diagram along the section line BB1 in FIG. 16. A first isolation structure 218 is formed in the second recess 216 and a second isolation structure 219 is formed in the third recess 217.

According to some embodiments, the first isolation structure 218 and the second isolation structure 219 are respectively disposed in the isolation regions II on both sides of the first region I. Therefore, the first word line gate structure 211 and the second word line gate structure 212 can completely cross the active area 201 in the first region I, which ensures completeness of input signals of the first word line gate structure 211 and the second word line gate structure 212.

The first isolation structure 218 and the second isolation structure 219 are made of a material including a dielectric material, and the dielectric material includes one or more selected from a group consisting of silicon oxide, silicon nitride, silicon carbide, silicon oxycarbide, silicon oxynitride, aluminum oxide, aluminum nitride, silicon carbide nitride, and silicon oxy-carbon nitride.

According to some embodiments, the first isolation structure 218 and the second isolation structure 219 are made of a material including silicon oxide.

Referring to FIG. 16 and FIG. 17, after the first isolation structure 218 and the second isolation structure 219 are formed, a first connection plate 220 is formed on the second connection gate 214 and a second connection plate 221 is formed on the first connection gate 213. The first connection plate 220 is electrically connected with the first word line gate structure 211 through the second connection gate 214. The second connection plate 221 is electrically connected with the second word line gate structure 212 through the first connection gate 213.

The first connection plate 220 and the second connection plate 221 are made of a material including metal, and the metal includes one or more selected from a group consisting of copper, aluminum, tungsten, cobalt, nickel and tantalum.

The first connection plate 220 is disposed on the second connection gate 214, and the second connection plate 221 is disposed on the first connection gate 213, so a process for separating the first connection gate 213 and the second connection gate 214 can be omitted. Thereby, damages to the first word line gate structure 211 and the second word line gate structure 212 caused during the process for separating the first connection gate 213 and the second connection gate 214 due to a small spacing between the first word line gate structure 211 and the second word line gate structure 212 can be avoided. Therefore, a performance of the semiconductor structure can be improved and a process window can be enlarged.

Accordingly, embodiments of the present disclosure further provides a semiconductor structure. Referring to FIG. 16 and FIG. 17, the semiconductor structure includes:

- a substrate 200;
- a plurality of first recesses 202 disposed in parallel along a second direction in the substrate 200;
- a first word line gate structure 211, a second word line gate structure 212, a first connection gate 213 and a second connection gate 214 disposed on side surfaces of a first recess 202;
- a dielectric layer 215 disposed in the first recess 202;
- a second recess disposed in the dielectric layer 215 in an isolation region II;
- a third recess disposed in the dielectric layer 215 in an isolation region II;
- a first isolation structure 218 disposed in the second recess;
- a second isolation structure 219 disposed in the third recess;
- a first connection plate 220 disposed on the second connection gate 214; and
- a second connection plate 221 disposed on the first connection gate 213.

The substrate 200 includes a plurality of active areas 201 arranged in parallel along a first direction X and a plurality of isolation regions II, and the first direction X is parallel to a surface of the substrate 200.

The plurality of first recesses 202 run through the plurality of active areas 201 and the plurality of isolation regions II, and the second direction Y is parallel to the surface of the substrate 200 and perpendicular to the first direction X.

The first word line gate structure 211 and the second word line gate structure 212 are respectively disposed on a side surface of the first recess 202 parallel to the first direction X. The first connection gate 213 and the second connection gate 214 are respectively disposed on a side surface of the first recess 202 parallel to the second direction Y. Two ends of the first word line gate structure 211 are respectively connected with two ends of the second word line gate structure 212 through the first connection gate 213 and the second connection gate 214.

The dielectric layer 215 is disposed on the first word line gate structure 211, on the second word line gate structure 212, on the first connection gate 213, and on the second connection gate 214.

The second recess runs through the first word line gate structure 211 along the second direction Y.

The third recess runs through the second word line gate structure 212 along the second direction Y. A central axis of the third recess along the second direction Y does not overlap with a central axis of the second recess along the second direction Y.

The first connection plate 220 is electrically connected with the first word line gate structure 211 through the second connection gate 214.

The second connection plate 221 is electrically connected with the second word line gate structure 212 through the first connection gate 213.

According to some embodiments, top surfaces of the first word line gate structure 211, the second word line gate structure 212, the first connection gate 213, the second connection gate 214 and the dielectric layer 215 are lower than a top surface of the substrate 200.

According to some embodiments, the semiconductor structure further includes: an insulating layer 203 disposed on the side surfaces and a bottom surface of the first recess. The first word line gate structure 211, the second word line gate structure 212, the first connection gate 213 and the second connection gate 214 are disposed on the insulating layer 203 on the side surfaces of the first recess.

According to some embodiments, the insulating layer 203 is made of a material including silicon oxide.

According to some embodiments, the first word line gate structure 211, the second word line gate structure 212, the first connection gate 213 and the second connection gate 214 are made of a material including metal, and the metal includes tungsten.

According to some embodiments, the substrate 200 includes a first region I, the plurality of active areas 201 are arranged in the first region I, and the isolation region II is adjacent to the first region I. The first isolation structure 218 and the second isolation structure 219 are respectively disposed in the isolation regions II on both sides of the first region I.

According to some embodiments, the dielectric layer 215 is made of a material including silicon oxide.

According to some embodiments, the first connection plate 220 and the second connection plate 221 are made of a material including metal, and the metal includes one or more selected from a group consisting of copper, aluminum, tungsten, cobalt, nickel and tantalum.

According to some embodiments, a spacing between the first word line gate structure 211 and the second word line gate structure 212 ranges from 15 nanometers to 20 nanometers.

Although the present disclosure has been disclosed above, the disclosure is not limited hereto. Those skilled in the art can modify and vary the embodiments without departing from the spirit and scope of the present disclosure. Therefore, the scope of protection of the present disclosure shall be subject to the scope defined in claims.

What is claimed is:

1. A semiconductor structure, comprising:
   - a substrate, wherein the substrate comprises a plurality of active areas arranged in parallel along a first direction and a plurality of isolation regions, and the first direction is parallel to a surface of the substrate;
   - a plurality of first recesses disposed in parallel along a second direction in the substrate, wherein the plurality of first recesses correspondingly run through the plurality of active areas and the plurality of isolation regions, and the second direction is parallel to the surface of the substrate and perpendicular to the first direction;
   - a first word line gate structure, a second word line gate structure, a first connection gate and a second connection gate disposed on side surfaces of a first recess, wherein the first word line gate structure and the second word line gate structure are respectively disposed on a side surface of the first recess parallel to the first direction, the first connection gate and the second connection gate are respectively disposed on a side surface of the first recess parallel to the second direction, and two ends of the first word line gate structure are respectively connected with two ends of the second word line gate structure through the first connection gate and the second connection gate;

a dielectric layer disposed in the first recess, wherein the dielectric layer is disposed on the first word line gate structure, on the second word line gate structure, on the first connection gate, and on the second connection gate;

a second recess disposed in the dielectric layer in an isolation region, wherein the second recess runs through the first word line gate structure along the second direction;

a third recess disposed in the dielectric layer in an isolation region, wherein the third recess runs through the second word line gate structure along the second direction, and a central axis of the third recess along the second direction does not overlap with a central axis of the second recess along the second direction;

a first isolation structure disposed in the second recess;

a second isolation structure disposed in the third recess;

a first connection plate disposed on the second connection gate, wherein the first connection plate is electrically connected with the first word line gate structure through the second connection gate; and a second connection plate disposed on the first connection gate, wherein the second connection plate is electrically connected with the second word line gate structure through the first connection gate.

2. The semiconductor structure according to claim 1, wherein top surfaces of the first word line gate structure, the second word line gate structure, the first connection gate, the second connection gate and the dielectric layer are lower than a top surface of the substrate.

3. The semiconductor structure according to claim 1, further comprising: an insulating layer disposed on the side surfaces and a bottom surface of the first recess, wherein the first word line gate structure, the second word line gate structure, the first connection gate and the second connection gate are disposed on the insulating layer on the side surfaces of the first recess.

4. The semiconductor structure according to claim 3, wherein the insulating layer is made of a material comprising a dielectric material, and the dielectric material comprises silicon oxide.

5. The semiconductor structure according to claim 1, wherein the first word line gate structure, the second word line gate structure, the first connection gate, and the second connection gate are made of a material comprising metal, and the metal comprises tungsten.

6. The semiconductor structure according to claim 1, wherein the substrate comprises a first region, the plurality of active areas are arranged in the first region, and the isolation region is adjacent to the first region; and the first isolation structure and the second isolation structure are respectively disposed in the isolation regions on both sides of the first region.

7. The semiconductor structure according to claim 1, wherein the dielectric layer is made of a material comprising silicon oxide.

8. The semiconductor structure according to claim 1, wherein the first connection plate and the second connection plate are made of a material comprising metal, and the metal comprises one or more selected from a group consisting of copper, aluminum, tungsten, cobalt, nickel and tantalum.

9. The semiconductor structure according to claim 1, wherein a spacing between the first word line gate structure and the second word line gate structure ranges from 15 nanometers to 20 nanometers.

10. A method for forming a semiconductor structure, comprising:

providing a substrate, wherein the substrate comprises a plurality of active areas arranged in parallel along a first direction and a plurality of isolation regions, and the first direction is parallel to a surface of the substrate;

forming a plurality of first recesses in the substrate, wherein the plurality of first recesses are disposed in parallel along a second direction and correspondingly run through the plurality of active areas and the plurality of isolation regions, and the second direction is parallel to the surface of the substrate and perpendicular to the first direction;

forming a first word line gate structure, a second word line gate structure, a first connection gate and a second connection gate on side surfaces of a first recess, wherein the first word line gate structure and the second word line gate structure are respectively disposed on a side surface of the first recess parallel to the first direction, the first connection gate and the second connection gate are respectively disposed on a side surface of the first recess parallel to the second direction, and two ends of the first word line gate structure are respectively connected with two ends of the second word line gate structure through the first connection gate and the second connection gate;

forming a dielectric layer in the first recess, wherein the dielectric layer is disposed on the first word line gate structure, on the second word line gate structure, on the first connection gate, and on the second connection gate;

removing the first word line gate structure and a part of the dielectric layer in an isolation region to form a second recess in the dielectric layer, wherein the second recess runs through the first word line gate structure along the second direction;

removing the second word line gate structure and a part of the dielectric layer in an isolation region to form a third recess in the dielectric layer, wherein the third recess runs through the second word line gate structure along the second direction, and a central axis of the third recess along the second direction does not overlap with a central axis of the second recess along the second direction;

forming a first isolation structure in the second recess, and forming a second isolation structure in the third recess;

after forming the first isolation structure and the second isolation structure, forming a first connection plate on the second connection gate, wherein the first connection plate is electrically connected with the first word line gate structure through the second connection gate; and forming a second connection plate on the first connection gate, wherein the second connection plate is electrically connected with the second word line gate structure through the first connection gate.

11. The method according to claim 10, wherein top surfaces of the first word line gate structure, the second word line gate structure, the first connection gate, the second connection gate and the dielectric layer are lower than a top surface of the substrate.

12. The method according to claim 11, further comprising: before forming the first word line gate structure, the second word line gate structure, the first connection gate and the second connection gate on the side surfaces of the first recess, forming an insulating layer on the side surfaces and a bottom surface of the first recess, wherein the first word line gate structure, the second word line gate structure, the first connection gate and the second connection gate are disposed on the insulating layer on the side surfaces of the first recess.

13. The method according to claim 12, wherein a method for forming the first word line gate structure, the second word line gate structure, the first connection gate, the second connection gate and the dielectric layer comprises:

forming a gate material layer on the insulating layer;

removing the gate material layer at a bottom of the first recess, and forming an initial first word line gate structure, an initial second word line gate structure, an initial first connection gate, and an initial second connection gate on the insulating layer on the side surfaces of the first recess;

forming an initial dielectric layer in the first recess, wherein the initial dielectric layer is disposed on the insulating layer, on the initial first word line gate structure, on the initial second word line gate structure, on the initial first connection gate and on the initial second connection gate; and etching back the initial first word line gate structure, the initial second word line gate structure, the initial first connection gate, the initial second connection gate, the initial dielectric layer and the gate material layer disposed on the surface of the substrate until a part of the insulating layer on sides of the first recess being exposed, forming the first word line gate structure, the second word line gate structure, the first connection gate and the second connection gate on the insulating layer on the side surfaces of the first recess, and forming the dielectric layer in the first recess.

14. The method according to claim 13, wherein the gate material layer is made of a material comprising metal, and the metal comprises tungsten.

15. The method according to claim 13, wherein etching back the initial first word line gate structure, the initial second word line gate structure, the initial first connection gate, the initial second connection gate, the initial dielectric layer and the gate material layer disposed on the surface of the substrate comprises a dry etching process.

16. The method according to claim 12, wherein the insulating layer is made of a material comprising a dielectric material, and the dielectric material comprises silicon oxide.

17. The method according to claim 10, wherein removing the first word line gate structure and a part of the dielectric layer in an isolation region and removing the second word line gate structure and a part of the dielectric layer in an isolation region comprise a dry etching process or a wet etching process.

18. The method according to claim 17, wherein the dry etching process comprises a first etching and a second etching, process parameters of the first etching comprise an etching gas comprising hydrogen fluoride, and process parameters of the second etching comprise an etching gas comprising chlorine.

19. The method according to claim 10, wherein the substrate comprises a first region, the plurality of active areas are arranged in the first region, and the isolation region is adjacent to the first region; and the first isolation structure and the second isolation structure are respectively disposed in the isolation regions on both sides of the first region.

20. The method according to claim 10, wherein the dielectric layer is made of a material comprising silicon oxide.

* * * * *